(12) United States Patent
Chen

(10) Patent No.: US 12,549,185 B2
(45) Date of Patent: Feb. 10, 2026

(54) LEVEL SHIFTER

(71) Applicant: Nuvoton Technology Corporation, Hsinchu Science Park (TW)

(72) Inventor: Chou-Chuan Chen, Toufen (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 9 days.

(21) Appl. No.: 18/892,767

(22) Filed: Sep. 23, 2024

(65) Prior Publication Data

US 2025/0141450 A1 May 1, 2025

(30) Foreign Application Priority Data

Oct. 31, 2023 (TW) ................................. 112141662

(51) Int. Cl.
*H03K 19/0185* (2006.01)
*H03K 19/017* (2006.01)

(52) U.S. Cl.
CPC ............... *H03K 19/018521* (2013.01); *H03K 19/01721* (2013.01)

(58) Field of Classification Search
CPC .............................................. H03K 19/018521
USPC ......................................................... 327/333
See application file for complete search history.

(56) References Cited

U.S. PATENT DOCUMENTS

| | | | |
|---|---|---|---|
| 2012/0112790 A1 | 5/2012 | Huang | |
| 2015/0288365 A1* | 10/2015 | Lai | G11C 16/14 327/333 |
| 2017/0250688 A1 | 8/2017 | Unno | |
| 2022/0158638 A1* | 5/2022 | Lee | H03K 19/018521 |
| 2023/0268925 A1* | 8/2023 | Hsu | H03K 3/356113 327/333 |
| 2025/0088179 A1* | 3/2025 | Cheng | H03K 19/0185 |

FOREIGN PATENT DOCUMENTS

| | | |
|---|---|---|
| CN | 104348469 A | 2/2015 |
| TW | 200803166 A | 1/2008 |
| TW | M574790 U | 2/2019 |
| TW | 202013891 A | 4/2020 |

* cited by examiner

*Primary Examiner* — Tomi Skibinski
(74) *Attorney, Agent, or Firm* — MUNCY, GEISSLER, OLDS & LOWE, P.C.

(57) ABSTRACT

A level shifter is disclosed. The input circuit receives an input signal operating within a first voltage range that is defined by a first voltage level. A pull-up circuit is coupled between a second voltage line and the input circuit. The second voltage line supplies a second voltage level. The second voltage level is higher than the first voltage level. A first connection node between the pull-up circuit and the input circuit serves as an output terminal of the level shifter. An acceleration circuit coupled to the first connection node accelerates the low-to-high transition at the output terminal. The acceleration controller for the acceleration circuit includes a first series of pulse generation transistors driven by first driving signals which have time differences therebetween, so that the acceleration controller enables the acceleration circuit in a pulse manner. The first driving signals are derived from the input signal.

10 Claims, 2 Drawing Sheets

ABSTRACT# LEVEL SHIFTER

CROSS REFERENCE TO RELATED APPLICATIONS

This Application claims priority of Taiwan Patent Application No. 112141662, filed on Oct. 31, 2023, the entirety of which is incorporated by reference herein.

BACKGROUND OF THE INVENTION

Field of the Invention

The present invention relates to a level shifter.

Description of the Related Art

A level shifter generally has an input circuit and a pull-up circuit cascaded above the input circuit. The input circuit is configured to receive an input signal operating within a first voltage range that is defined by a first voltage level. The pull-up circuit is coupled to a second voltage level higher than the first voltage level. Thus, the voltage level of the input signal is pulled up to form an output signal.

The input circuit is also responsible for the high-to-low transition ('1'→'0') of the output signal. In order to make the high-to-low transition of the output signal ('1'→'0') smooth, the driving capability of the pull-up circuit cannot be too strong. However, this also results in the low-to-high transition ('0'→'1') not being immediate.

How to provide a high-speed level shifter is an important issue in this technical field.

BRIEF SUMMARY OF THE INVENTION

An objective of the present invention is to disclose a level shifter with high-speed transition.

A level shifter in accordance with an exemplary embodiment of the disclosure includes an input circuit, a pull-up circuit, an acceleration circuit, and an acceleration controller. The input circuit receives an input signal operating within a first voltage range that is defined by a first voltage level. The pull-up circuit is coupled between a second voltage line and the input circuit, wherein the second voltage line supplies a second voltage level. The second voltage level is higher than the first voltage level. The first connection node between the pull-up circuit and the input circuit serves as an output terminal of the level shifter. The acceleration circuit is coupled to the first connection node to accelerate a low-to-high transition at the output terminal. The acceleration controller is coupled to the acceleration circuit, and includes a first series of pulse generation transistors which are connected in series on a first side. The first series of pulse generation transistors receive first driving signals, which have time differences between them, and thereby the acceleration controller enables the acceleration circuit in a pulse manner (e.g. driven by pulse signals). The first driving signals are derived from the input signal.

With this design, a real-time pulse enablement of the acceleration circuit without complex logic calculations is shown. This proposed acceleration controller does not use any NAND, NOR, AND, OR logic gates.

In an exemplary embodiment, the acceleration circuit includes a first current mirror, which is controlled by the acceleration controller to provide a first acceleration current to the first connection node in the pulse manner. The first current mirror includes a first current mirroring transistor and a second current mirroring transistor which use p-type channels. A gate terminal of the first current mirroring transistor is coupled to a drain terminal of the first current mirroring transistor as well as a gate terminal of the second current mirroring transistor. A source terminal of the first current mirroring transistor is coupled to the second voltage line. The first current mirroring transistor is coupled to the first series of pulse generation transistors through the drain terminal of the first current mirroring transistor. The source terminal of the second current mirroring transistor is coupled to the second voltage line. The first acceleration current is provided to the first connection node through the drain terminal of the second current mirroring transistor.

In an exemplary embodiment, the acceleration controller further includes a first delay circuit that receives an inverted input signal that is inverted from the input signal, to generate a delayed inverted input signal. The first series of pulse generation transistors include a first pulse generation transistor and a second pulse generation transistor which use N-type channels. The first pulse generation transistor has a source terminal coupled to ground, and has a gate terminal receiving the inverted input signal. The second pulse generation transistor has a source terminal coupled to a drain terminal of the first pulse generation transistor, a gate terminal receiving the delayed inverted input signal from the first delay circuit, and a drain terminal coupled to the drain terminal of the first current mirroring transistor. Specifically, the acceleration controller does not include any NAND, NOR, AND, OR logic gates.

In an exemplary embodiment, the level shifter further includes a leakage protection circuit that couples the gate terminal of the first current mirroring transistor and the gate terminal of the second current mirroring transistor to the second voltage line when the acceleration circuit is disabled. In this manner, the first current mirror is indeed turned off, effectively avoiding current leakage.

In an exemplary embodiment, the gate terminal of the first current mirroring transistor is coupled to the gate terminal of the second current mirroring transistor and the drain terminal of the first current mirroring transistor through a first resistance component. This design makes the first current mirror to respond more quickly and provide the first acceleration current.

The same design may be applied to the inverting output terminal of the level converter. In this way, the low-to-high transition of the inverting output terminal is also effectively accelerated, and it is a power-saving solution. The output terminal of the level shifter can instantly changes from high to low in a low power consumption way.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
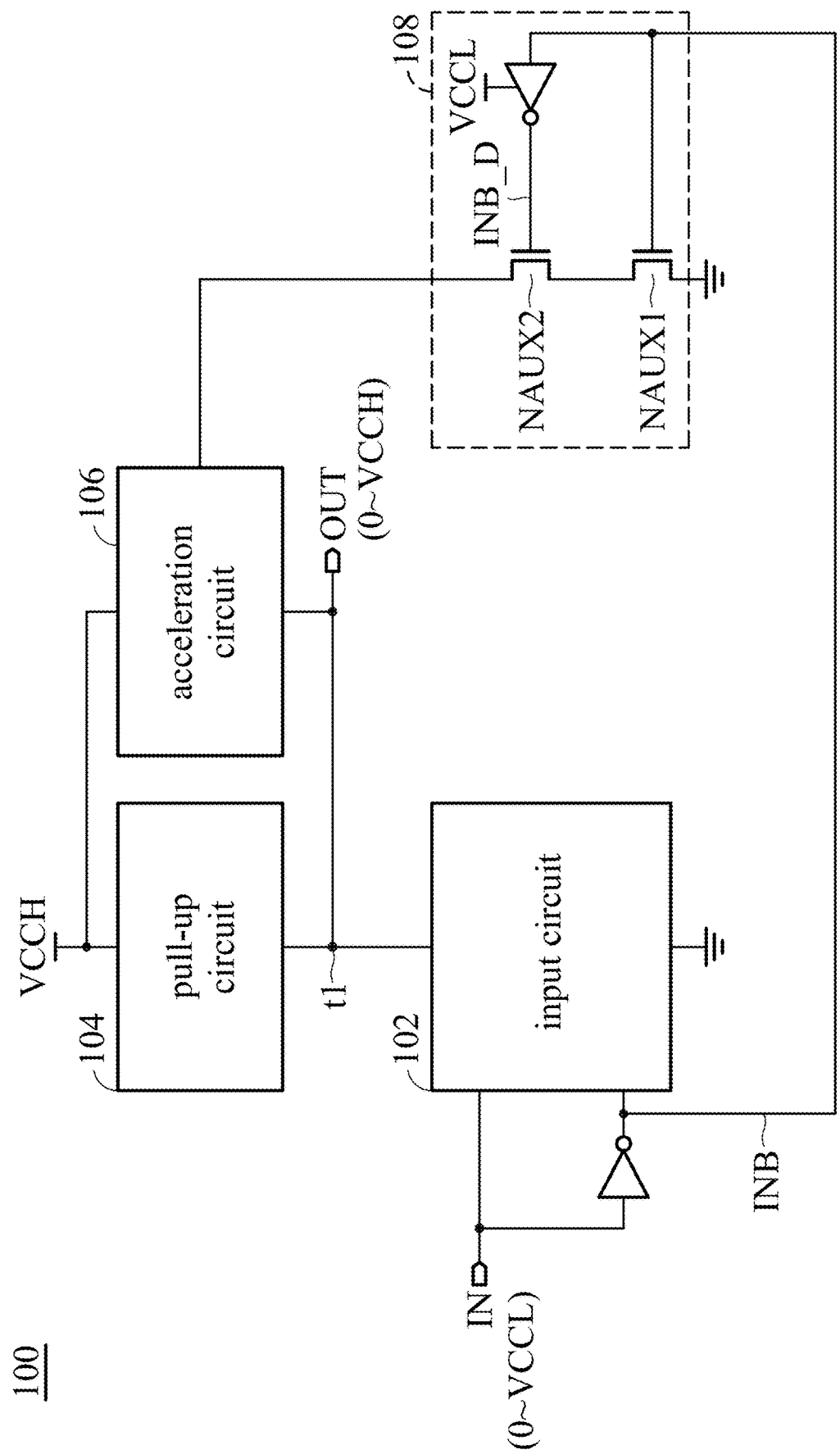
FIG. 1 is a block diagram illustrating a level shifter 100 in accordance with an exemplary embodiment of the disclosure.

FIG. 1 is a block diagram illustrating a level shifter 100 in accordance with an exemplary embodiment of the disclosure, which converts an input signal IN operated within a first voltage range (defined by a first voltage level VCCL) to a wider voltage range (defined by a second voltage level VCCH greater than the first voltage level VCCL), and thereby generates an output signal OUT.

The level shifter 100 includes an input circuit 102, a pull-up circuit 104, an acceleration circuit 106, and an acceleration controller 108. The input circuit 102 receives the input signal IN operating within the first voltage range 0~VCCL volts. The pull-up circuit 104 is coupled between a second voltage line (supplying the second voltage level VCCH) and the input circuit 102. A first connection node t1 between the pull-up circuit 104 and the input circuit 102 serves as an output terminal (also presented by OUT) of the level shifter 100. The input signal IN can activate the pull-up circuit 104 through the input circuit 102 to pull up the output terminal OUT to a high state. In another situation, the output signal OUT can be pulled down to a low state by the input circuit 102. Under the traditional design, in order to allow the transistors of the input circuit 102 to smoothly pull down the voltage level of the output terminal OUT, the pull-up capability of the transistors of the pull-up circuit 104 cannot be too strong, which results in a slow low-to-high transition speed at the output terminal OUT.

In the disclosure, the acceleration circuit 106 is proposed, which is coupled to the first connection node t1 to speed up the low-to-high transition (from 0V to VCCH) at the output terminal OUT. Specifically, the acceleration controller 108 coupled to the acceleration circuit 106 includes a first series of pulse generation transistors NAUX1 and NAUX2. The first series of pulse generation transistors receive first driving signals. There are time differences between the first driving signals. For example, the pulse generation transistor NAUX1 is driven by an inverted input signal INB, and the pulse generation transistor NAUX2 is driven by a delayed inverted input signal INB_B. Thus, first series of pulse generation transistors NAUX1 and NAUX2 are suddenly turned on. The acceleration circuit 106, therefore, is turned on momentarily and then returns to the off state. The transistors NAUX1 and NAUX2 may be driven by other signals that also change with the input signal IN. In some exemplary embodiments, the number of transistors connected in series may be more than two. For the acceleration controller 108 implemented by serially connected transistors (e.g., NAUX1 and NAUX2), the driving signals can be quite simple and may be derived from the input signal IN without complex logical calculations. For example, in some exemplary embodiments, the acceleration controller 108 does not include any NAND, NOR, AND, OR logic gates. In this way, the acceleration circuit 106 is enabled in a pulse manner (e.g. driven by pulse signals) without involving any complex logical calculations, so that a real-tine low-to-high transition at the output terminal OUT of the level shifter 100 is achieved. In response to the low-to-high change of the input signal IN, the output signal OUT is immediately pulled up to complete a real-time low-to-high transition (a change from 0V to VCCH).

The same design may be applied to the inverting output terminal (OUTB hereinafter) of the level shifter 100. In this way, the low-to-high transition of the inverting output terminal OUTB is also effectively accelerated. For a pull-up circuit with a cross-coupled structure, the high-speed low-to-high transition at the inverting output terminal OUTB results in the high-speed high-to-low transition at the output terminal OUT of the level shifter 100. A level shifter with high speed transition is shown.

Figure 2:
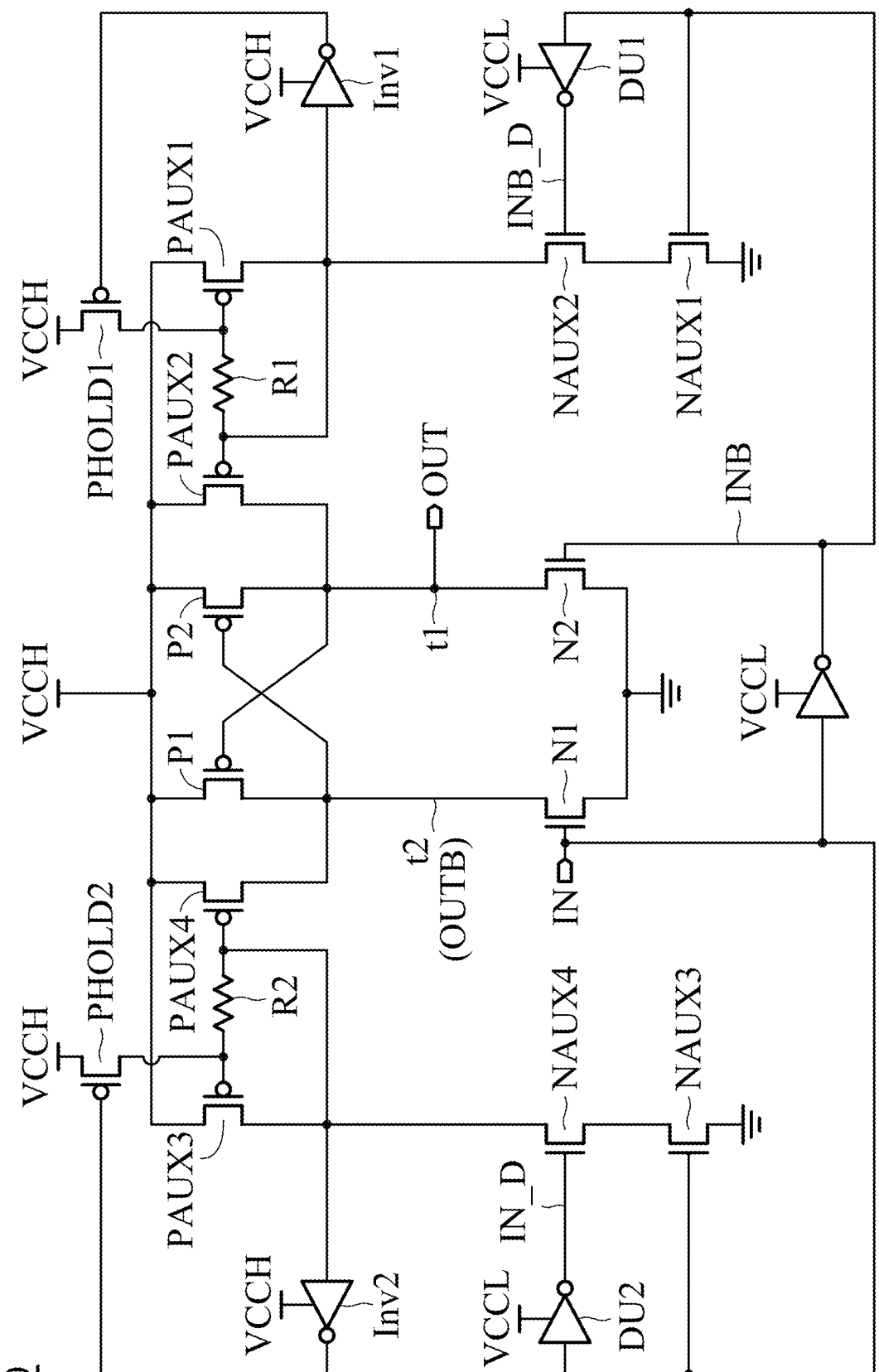
FIG. 2 illustrates circuit details of a level shifter 200 in accordance with an exemplary embodiment of the disclosure.

FIG. 2 illustrates circuit details of a level shifter 200 in accordance with an exemplary embodiment of the disclosure. N-channel transistors (such as NMOSs) N1 and N2 form the input circuit, respectively receiving the input signal IN and the inverted input signal INB of the first voltage rang (defined by VCCL) through their gate terminal. The input signal IN and the inverted input signal INB may operate between 0 to VCCL volt. P-channel transistors (such as PMOSs) P1 and P2 are cross coupled to form the pull-up circuit, and are coupled to the input circuit via the first connection node t1 and the second connection node t2. The first connection node t1 and the second connection node t2 serve as the output terminal OUT and the inverted output terminal OUTB of the level shifter 200, respectively, to generate the output signal OUT and the inverted output signal OUTB operating within the secondo voltage range (defined by VCCH greater than VCCL). The output signal OUT and the inverted output signal OUTB may operate between 0 to VCCH volt.

In FIG. 2, a first current mirroring transistor PAUX1 and a second current mirroring transistor PAUX2 using P-type channels form a first current mirror, and a third current mirroring transistor PAUX3 and a fourth current mirroring transistor PAUX4 using P-type channels form a second current mirror. The first current mirror and the second current mirror form the acceleration circuit. The first current mirror (including PAUX1 and PAUX2) provides a first acceleration current to the first connection node t1 to accelerate the low-to-high transition of the output terminal OUT. The second current mirror (including PAUX3 and PAUX4) provides a second acceleration current to the second connection node t2 to accelerate the low-to-high transition of the inverting output terminal OUTB. In response to the sudden 'on' status of the first series of pulse generation transistors NAUX1 and NAUX2, the first current mirror (PAUX1 and PAUX2) is turned on in a pulse manner. Similarly, in response to the sudden 'on' status of the second series of pulse generation transistors NAUX3 and NAUX4, the second current mirror (PAUX3 and PAUX4) is turned on in a pulse manner. The circuit that supports the pulse control does not include any NAND, NOR, AND, OR logic gates, and a real-time level shifter is achieved.

In FIG. 2, in addition to the first pulse generation transistor NAUX1 and the second pulse generation transistor NAUX2 of the N-type channels, the accelerator controller further uses a first delay circuit DU1 for the control of the first current mirror (PAUX1 and PAUX2). First, the circuit details of the first current mirror (PAUX1 and PAUX2) are described. A gate terminal of the first current mirroring transistor PAUX1 is coupled to a drain terminal of the first current mirroring transistor PAUX1 and a gate terminal of the second current mirroring transistor PAUX2. A source terminal of the first current mirroring transistor PAUX1 is coupled to the second voltage line VCCH. The drain terminal of the first current mirroring transistor PAUX1 is coupled to the pulse generation transistors NAUX1 and NAUX2. A source terminal of the second current mirroring transistor PAUX2 is coupled to the second voltage line VCCH. The second current mirroring transistor PAUX2 provides the first acceleration current to the first connection node t1 through its drain terminal. As for the acceleration control circuit, the first delay circuit DU1 receives an inverted input signal INB that is inverted from the input signal IN, and thereby a delayed inverted input signal INB_D is generated. The first pulse generation transistor NAUX1 has a source terminal connected to ground and a gate terminal receiving the inverted input signal INB. The second pulse generation transistor NAUX2 has a source terminal coupled to a drain terminal of the first pulse generation transistor NAUX1, a gate terminal receiving the delayed inverted input signal INB_D from the first delay circuit DU1, and a drain terminal coupled to the drain terminal of the first current mirroring transistor PAUX1.

Specifically, the gate terminal of the first current mirroring transistor PAUX1 is coupled to the gate terminal of the second current mirroring transistor PAUX2 as well as to the drain terminal of the first current mirroring transistor PAUX1 through a first resistance element R1. The first resistance element R1 may be any high resistance element, whose low-pass capability effectively suppresses the diode current of the first current mirroring transistor PAUX1. Thus, the first current mirror (PAUX1 and PAUX2) provides the first acceleration current to the first connection node t1 immediately, and the low-to-high transition at the output terminal OUT is accelerated.

FIG. 2 further introduces a leakage protection circuit for the acceleration circuit. In this figure, a first leakage protection transistor PHOLD1 with a P-type channel and a first inverter Inv1 are proposed to realize the leakage protection of the first current mirror (PAUX1 and PAUX2). The first leakage protection transistor PHOLD1 has a source terminal coupled to the second voltage line VCCH, and a drain terminal coupled to the gate terminal of the first current mirroring transistor PAUX1. The first inverter Inv1 has an input terminal coupled to the drain terminal of the first current mirroring transistor PAUX1, and has an output terminal coupled to a gate terminal of the first leakage protection transistor PHOLD1. When the first current mirror (PAUX1 and PAUX2) is disabled, the first series of pulse generation transistors NAUX1 and NAUX2 are turned off (open circuit), the drain terminal of the first current mirroring transistor PAUX1 is pulled up, and the first inverter Inv1 generates a low-state signal to turn on the first leakage protection transistor PHOLD1. Accordingly, the gate terminal of the first current mirroring transistor PAUX1 and the gate terminal of the second current mirroring transistor PAUX2 are connected to the second voltage line VCCH. In this way, the first current mirrors (PAUX1 and PAUX2) are indeed turned off, effectively suppressing the current leakage.

The inverting output terminal OUTB may have the same low-to-high transition acceleration design. The following describes the circuit details controlling the inverting output terminal OUTB.

In FIG. 2, in addition to the third pulse generation transistor NAUX3 and the fourth pulse generation transistor NAUX4 of the N-type channels, the accelerator controller further uses a second delay circuit DU1 for the control of the second current mirror (PAUX3 and PAUX4). First, the circuit details of the second current mirror (PAUX3 and PAUX4) are described. A gate terminal of the third current mirroring transistor PAUX3 is coupled to a drain terminal of the third current mirroring transistor PAUX3 and a gate terminal of the fourth current mirroring transistor PAUX4. A source terminal of the third current mirroring transistor PAUX3 is coupled to the second voltage line VCCH. The drain terminal of the third current mirroring transistor PAUX3 is coupled to the pulse generation transistors NAUX3 and NAUX4. A source terminal of the fourth current mirroring transistor PAUX4 is coupled to the second voltage line VCCH. The fourth current mirroring transistor PAUX4 provides the second acceleration current to the second connection node t2 through its drain terminal. As for the acceleration control circuit, the second delay circuit DU2 receives the input signal IN, and thereby a delayed input signal IN_D is generated. The third pulse generation transistor NAUX3 has a source terminal connected to ground and a gate terminal receiving the input signal IN. The fourth pulse generation transistor NAUX4 has a source terminal coupled to a drain terminal of the third pulse generation transistor NAUX3, a gate terminal receiving the delayed input signal IN_D from the second delay circuit DU2, and a drain terminal coupled to the drain terminal of the third current mirroring transistor PAUX3.

Specifically, the gate terminal of the third current mirroring transistor PAUX3 is coupled to the gate terminal of the fourth current mirroring transistor PAUX4 as well as to the drain terminal of the third current mirroring transistor PAUX3 through a second resistance element R2. The second resistance element R2 may be any high resistance element, whose low-pass capability effectively suppresses the diode current of the third current mirroring transistor PAUX3. Thus, the second current mirror (PAUX3 and PAUX4) provides the second acceleration current to the second connection node t2 immediately, and the low-to-high transition at the inverting output terminal OUTB is accelerated.

In FIG. 2, a second leakage protection transistor PHOLD2 with a P-type channel and a second inverter Inv2 are proposed to realize the leakage protection of the second current mirror (PAUX3 and PAUX4). The second leakage protection transistor PHOLD2 has a source terminal coupled to the second voltage line VCCH, and a drain terminal coupled to the gate terminal of the third current mirroring transistor PAUX3. The second inverter Inv2 has an input terminal coupled to the drain terminal of the third current mirroring transistor PAUX3, and has an output terminal coupled to a gate terminal of the second leakage protection transistor PHOLD2. When the second current mirror (PAUX3 and PAUX4) is disabled, the second series of pulse generation transistors NAUX3 and NAUX4 are turned off (open circuit), the drain terminal of the third current mirroring transistor PAUX3 is pulled up, and the second inverter Inv2 generates a low-state signal to turn on the second leakage protection transistor PHOLD2. Accordingly, the gate terminal of the third current mirroring transistor PAUX3 and the gate terminal of the fourth current mirroring transistor PAUX4 are connected to the second voltage line VCCH. In this way, the second current mirrors (PAUX3 and PAUX4) are indeed turned off, effectively suppressing the current leakage.

For clarity of description, the first series of pulse generation transistors NAUX1 and NAUX2 for the transition acceleration control of the output terminal OUT can be understood as a series of pulse generation transistors connected in series on the first side of the level shifter, and the second series of pulse generation transistors NAUX3 and NAUX4 for the transition acceleration control of the inverting output terminal OUTB can be understood as a series of pulse generation transistors connected in series on the second side of the level shifter.

The aforementioned circuits each may have several variations. For example, the input circuit and the pull-up circuit may have various modifications. The acceleration circuit and the leakage protection circuit may have many variations. The acceleration controller may also be slightly modified.

Any level shifter design using a series of transistors (connected in series) to control voltage transition acceleration in a pulse manner should be considered within the scope of the disclosure. In particular, according to such a design, no NAND, NOR, AND, or OR logic gates are required to implement the acceleration controller.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
    an input circuit, receiving an input signal operating within a first voltage range, wherein the first voltage range is defined by a first voltage level;
    a pull-up circuit, coupled between a second voltage line and the input circuit, wherein the second voltage line supplies a second voltage level that is higher than the first voltage level, and a first connection node between the pull-up circuit and the input circuit serves as an output terminal of the level shifter;
    an acceleration circuit, coupled to the first connection node to accelerate a low-to-high transition at the output terminal; and
    an acceleration controller, coupled to the acceleration circuit, and comprising a first series of pulse generation transistors which are connected in series on a first side, wherein;
    the first series of pulse generation transistors receive first driving signals, wherein there are time differences between the first driving signals, so that the acceleration controller enables the acceleration circuit in a pulse manner; and
    the first driving signals are derived from the input signal.

2. The level shifter as claimed in claim 1, wherein:
    the acceleration circuit comprises a first current mirror, which is controlled by the acceleration controller to provide a first acceleration current to the first connection node in the pulse manner,
    the first current mirror comprises a first current mirroring transistor and a second current mirroring transistor which use p-type channels,
    a gate terminal of the first current mirroring transistor is coupled to a drain terminal of the first current mirroring transistor as well as a gate terminal of the second current mirroring transistor,
    a source terminal of the first current mirroring transistor is coupled to the second voltage line,
    the first current mirroring transistor is coupled to the first series of pulse generation transistors through the drain terminal of the first current mirroring transistor,
    a source terminal of the second current mirroring transistor is coupled to the second voltage line, and
    the first acceleration current is provided to the first connection node through a drain terminal of the second current mirroring transistor.

3. The level shifter as claimed in claim 2, wherein:
    the acceleration controller further comprises a first delay circuit that receives an inverted input signal that is inverted from the input signal, to generate a delayed inverted input signal;
    the first series of pulse generation transistors include a first pulse generation transistor and a second pulse generation transistor which use N-type channels;
    the first pulse generation transistor has a source terminal coupled to ground, and has a gate terminal receiving the inverted input signal; and
    the second pulse generation transistor has a source terminal coupled to a drain terminal of the first pulse generation transistor, a gate terminal receiving the delayed inverted input signal from the first delay circuit, and a drain terminal coupled to the drain terminal of the first current mirroring transistor.

4. The level shifter as claimed in claim 2, further comprising:
    a leakage protection circuit, coupling the gate terminal of the first current mirroring transistor and the gate terminal of the second current mirroring transistor to the second voltage line when the acceleration circuit is disabled.

5. The level shifter as claimed in claim 4, wherein the leakage protection circuit comprises:
    a first leakage protection transistor using a P-type channel, having a source terminal coupled to the second voltage line and a drain terminal coupled to the gate terminal of the first current mirroring transistor; and
    a first inverter, having an input terminal coupled to the drain terminal of the first current mirroring transistor, and an output terminal coupled to a gate terminal of the first leakage protection transistor.

6. The level shifter as claimed in claim 2, wherein
    the gate terminal of the first current mirroring transistor is coupled to the gate terminal of the second current mirroring transistor and the drain terminal of the first current mirroring transistor through a first resistance component.

7. The level shifter as claimed in claim 2, wherein
    a second connection node between the pull-up circuit and the input circuit serves as an inverting output terminal of the level shifter,
    the acceleration circuit further comprises a second current mirror controlled by the acceleration controller to provide a second acceleration current to the second connection node in the pulse manner, to accelerate a low-to-high transition at the inverting output terminal,
    the acceleration controller further comprises a second series of pulse generation transistors which are connected in series on a second side, wherein the second series of pulse generation transistors receive second driving signals which have time differences therebetween, so that the acceleration controller enables the acceleration circuit in the pulse manner,
    based on the input signal, the level shifter provides the second driving signals to the second series of pulse generation transistors,
    the second current mirror comprises a third current mirroring transistor and a fourth current mirroring transistor which use P-type channels,
    a gate terminal of the third current mirroring transistor is coupled to a drain terminal of the third current mirroring transistor and a gate terminal of the fourth current mirroring transistor,
    a source terminal of the third current mirroring transistor is coupled to the second voltage line,
    the third current mirroring transistor is coupled to the second series of pulse generation transistors through the drain terminal of the third current mirroring transistor, a source terminal of the fourth current mirroring transistor is coupled to the second voltage line, and the second acceleration current is coupled to the second connection node through a drain terminal of the fourth current mirroring transistor.

8. The level shifter as claimed in claim 7, wherein:

the acceleration controller further comprises a second delay circuit that receives the input signal to generate a delayed input signal;

the second series of pulse generation transistors comprise a third pulse generation transistor and a fourth pulse generation transistor which use N-type channels;

the third pulse generation transistor has a source terminal coupled to ground, and a gate terminal operative to receive the input signal; and the fourth pulse generation transistor has a source terminal coupled to a drain terminal of the third pulse generation transistor, a gate terminal receiving the delayed input signal from the second delay circuit, and a drain terminal coupled to the drain terminal of the third current mirroring transistor.

9. The level shifter as claimed in claim 7, further comprising:

a leakage protection circuit, coupling the gate terminal of the third current mirroring transistor and the gate terminal of the fourth current mirroring transistor to the second voltage line when the acceleration circuit is disabled;

wherein the leakage protection circuit comprises:

a second leakage protection transistor using a P-type channel, which has a source terminal coupled to the second voltage line and a drain terminal coupled to the gate terminal of the third current mirroring transistor; and a second inverter, having an input terminal coupled to the drain terminal of the third current mirroring transistor, and an output terminal coupled to a gate terminal of the second leakage protection transistor.

10. The level shifter as claimed in claim 7, wherein:

through a second resistance element, the gate terminal of the third current mirroring transistor is coupled to the gate terminal of the fourth current mirroring transistor and the drain terminal of the third current mirroring transistor.

* * * * *